(12) United States Patent
Karda et al.

(10) Patent No.: US 10,734,388 B1
(45) Date of Patent: Aug. 4, 2020

(54) INTEGRATED ASSEMBLIES HAVING THRESHOLD-VOLTAGE-INDUCING-STRUCTURES PROXIMATE GATED-CHANNEL-REGIONS, AND METHODS OF FORMING INTEGRATED ASSEMBLIES

(71) Applicant: Micron Technology, Inc., Boise, ID (US)

(72) Inventors: Kamal M. Karda, Boise, ID (US); Si-Woo Lee, Boise, ID (US); Haitao Liu, Boise, ID (US); Deepak Chandra Pandey, Uttarakhand (IN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/248,534

(22) Filed: Jan. 15, 2019

(51) Int. Cl.
| | | |
|---|---|---|
| *H01L 27/108* | (2006.01) | |
| *H01L 29/10* | (2006.01) | |
| *H01L 29/49* | (2006.01) | |
| *H01L 29/167* | (2006.01) | |

(52) U.S. Cl.
CPC .. *H01L 27/10823* (2013.01); *H01L 27/10814* (2013.01); *H01L 27/10855* (2013.01); *H01L 27/10876* (2013.01); *H01L 27/10885* (2013.01); *H01L 27/10891* (2013.01); *H01L 29/1037* (2013.01); *H01L 29/167* (2013.01); *H01L 29/495* (2013.01); *H01L 29/4916* (2013.01); *H01L 29/4966* (2013.01)

(58) Field of Classification Search
CPC ......... H01L 27/10823; H01L 27/10855; H01L 27/10876; H01L 27/10885
USPC ....................................... 257/296, 298, 300
See application file for complete search history.

(56) References Cited

U.S. PATENT DOCUMENTS 9,252,148 B2 * 2/2016 Hasegawa ........... H01L 27/0694

\* cited by examiner

*Primary Examiner* — Tan N Tran
(74) *Attorney, Agent, or Firm* — Wells St. John P.S.

(57) ABSTRACT

Some embodiments include an integrated assembly having an active-region-pillar extending upwardly from a base. The active-region-pillar includes a digit-line-contact-region between a first storage-element-contact-region and a second storage-element-contact-region. A threshold-voltage-inducing-structure is adjacent a lower portion of the active-region-pillar. A first channel region includes a first portion of the active-region-pillar between the digit-line-contact-region and the first storage-element-contact-region. A second channel region includes a second portion of the active-region-pillar between the digit-line-contact-region and the second storage-element-contact-region. A first wordline is adjacent the first portion of the active-region-pillar. A second wordline is adjacent the second portion of the active-region-pillar. A digit-line is coupled with the digit-line-contact-region. First and second storage-elements are coupled with the first and second storage-element-contact-regions. A voltage source is coupled with the threshold-voltage-inducing-structure to electrostatically induce a desired threshold voltage along the first and second channel regions.

25 Claims, 17 Drawing Sheets

INTEGRATED ASSEMBLIES HAVING THRESHOLD-VOLTAGE-INDUCING-STRUCTURES PROXIMATE GATED-CHANNEL-REGIONS, AND METHODS OF FORMING INTEGRATED ASSEMBLIES

TECHNICAL FIELD

Integrated assemblies having threshold-voltage-inducing-structures proximate gated-channel-regions, and methods of forming integrated assemblies.

BACKGROUND

Memory is one type of integrated circuitry, and is used in computer systems for storing data. An example memory is DRAM (dynamic random-access memory). DRAM cells may each comprise an access transistor in combination with a capacitor. The DRAM cells may be arranged in an array; with wordlines extending along rows of the array, and digit-lines extending along columns of the array. The wordlines may be coupled with the access transistors of the memory cells. Each memory cell may be uniquely addressed through a combination of one of the wordlines with one of the digit-lines.

The wordlines may be proximate channel regions of the access transistors, and may gatedly induce current flow along the channel regions. Regions of the wordlines along the access transistors may be considered to correspond to transistor gates. Each of the access transistors may be characterized by a threshold voltage ($V_T$), which is the minimum gate-to-source voltage which will induce current flow along the channel region of the transistors. Ideally, all of the access transistors within a memory array will have identical $V_T$, but such is generally not practical due to limitations of existing processes. Instead, the access transistors are fabricated to have $V_T$ within a suitable range.

Generally, $V_T$ is adjusted by providing suitable dopant (e.g., boron) within semiconductor material of transistor channel regions to suitable concentration to generate the desired $V_T$ within the transistor channel regions. However, as channel regions are scaled to increasing smaller (thinner) dimensions with increasing levels of integration, it is becoming increasingly difficult to adjust $V_T$ with dopant implants. One of the problems is that the dopant levels are so low with small-dimension-channel-regions that minor variations in doping can lead to large changes in $V_T$, leading to unacceptable variation of $V_T$ across a memory array; and, in some cases, pushing too many of the access devices outside of acceptable tolerances.

It is desirable to develop new approaches for adjusting $V_T$, new architectures suitable for utilizing the new approaches, and new methods for forming suitable architectures.

BRIEF DESCRIPTION OF THE DRAWINGS

FIG. 1 is a diagrammatic top-down view; FIGS. 1C and 1D are diagrammatic cross-sectional top-down views.

DETAILED DESCRIPTION OF THE ILLUSTRATED EMBODIMENTS

Some embodiments include assemblies having threshold-voltage-inducing-structures proximate transistor channel regions, and configured to electrostatically induce desired threshold voltages within the channel regions. The threshold-voltage-inducing-structures may be incorporated into memory arrays, such as, for example, DRAM arrays. Some embodiments include methods of forming integrated assemblies having threshold-voltage-inducing-structures proximate transistor channel regions. Example embodiments are described below with reference to FIGS. 1-14.

Figure 1:
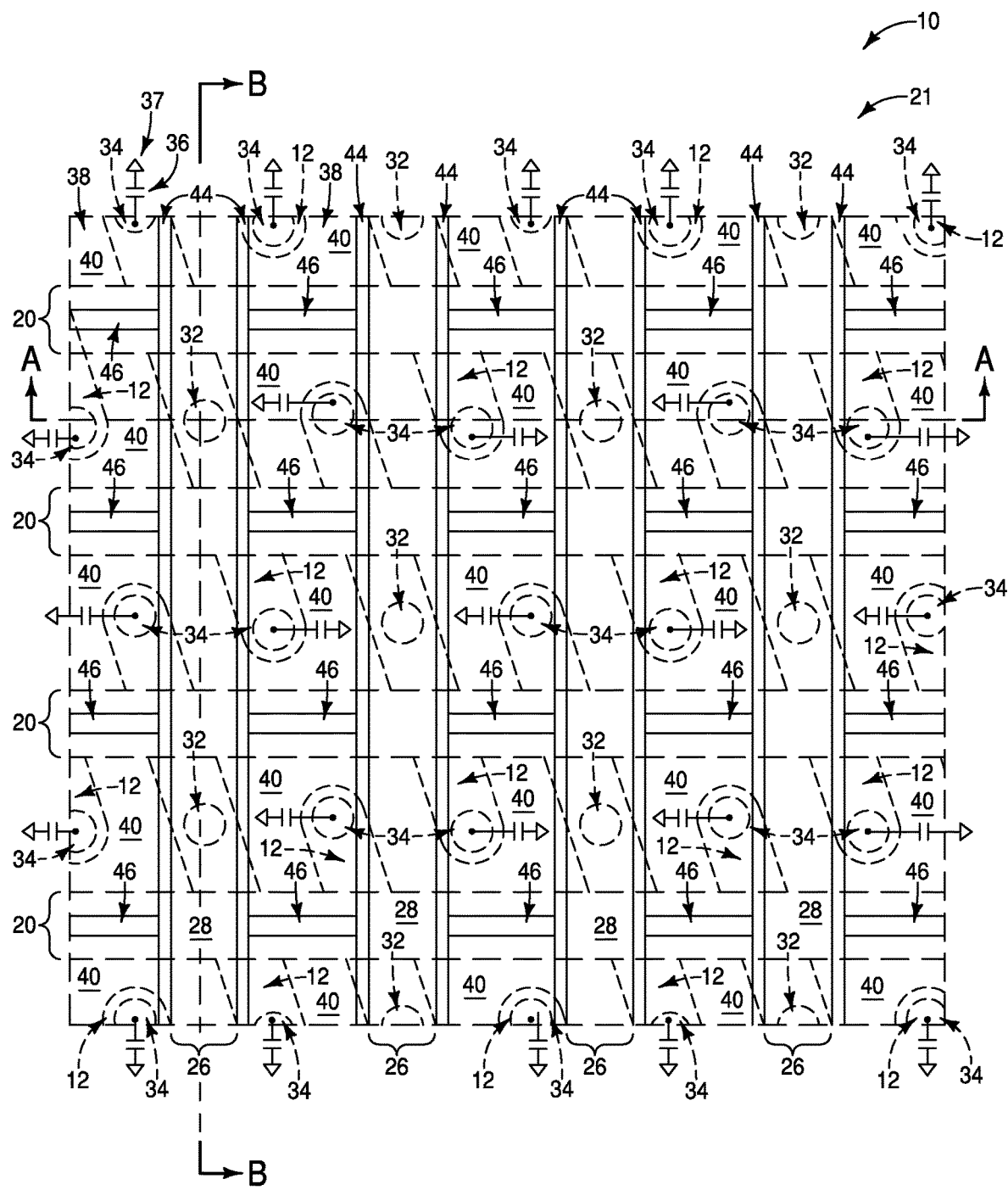
FIGS. 1-1D are diagrammatic views of a region of an example integrated assembly comprising an example memory array.
Figure 1A:
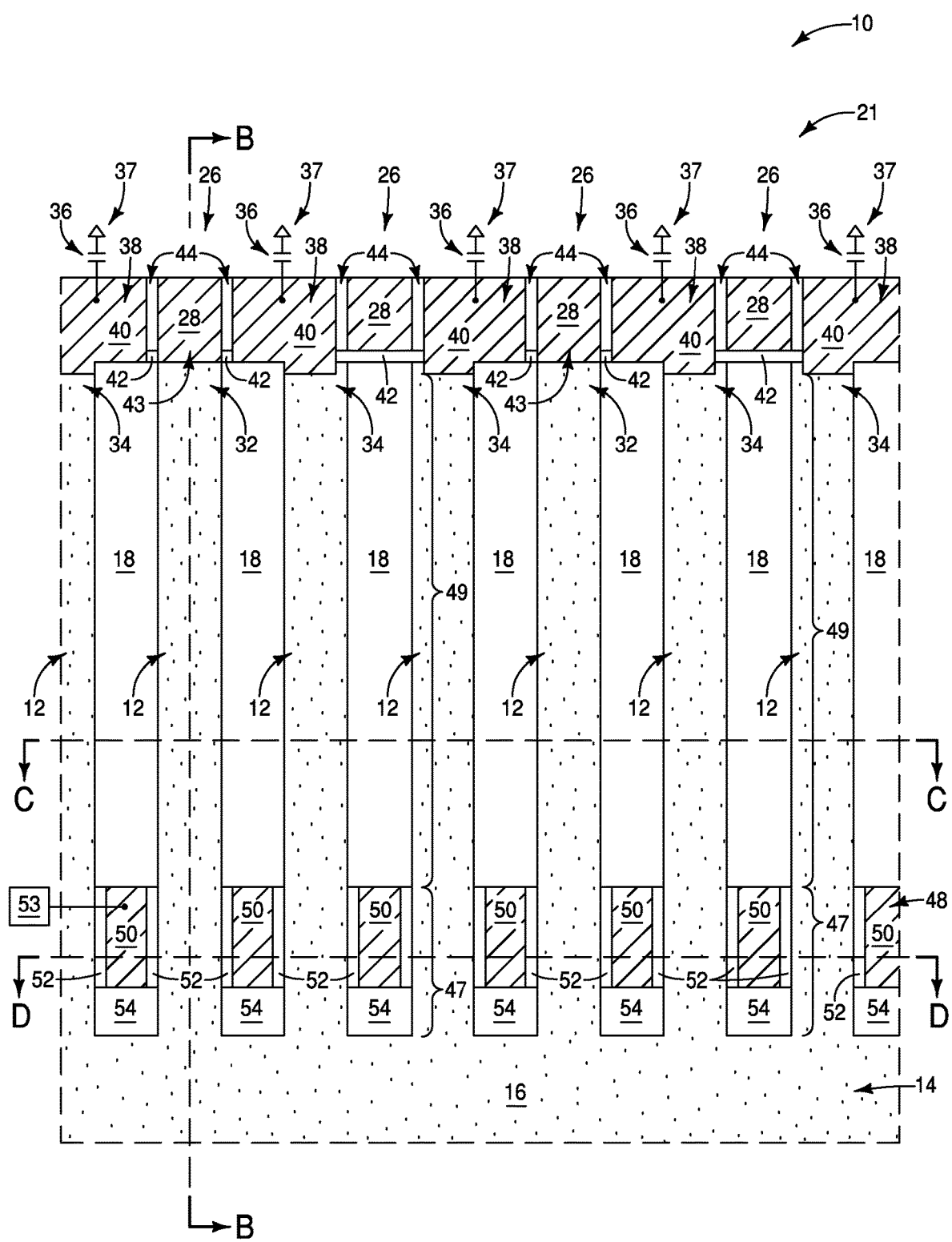
FIGS. 1A and 1B are diagrammatic cross-sectional side views. The view of FIG. 1A is along the lines A-A of FIGS. 1, 1B, 1C and 1D. The view of FIG. 1B is along the lines B-B of FIGS. 1, 1A, 1C and 1D. The view of FIG. 1C is along the lines C-C of FIGS. 1A and 1B. The view of FIG. 1D is along the lines D-D of FIGS. 1A and 1B.
Figure 1B:
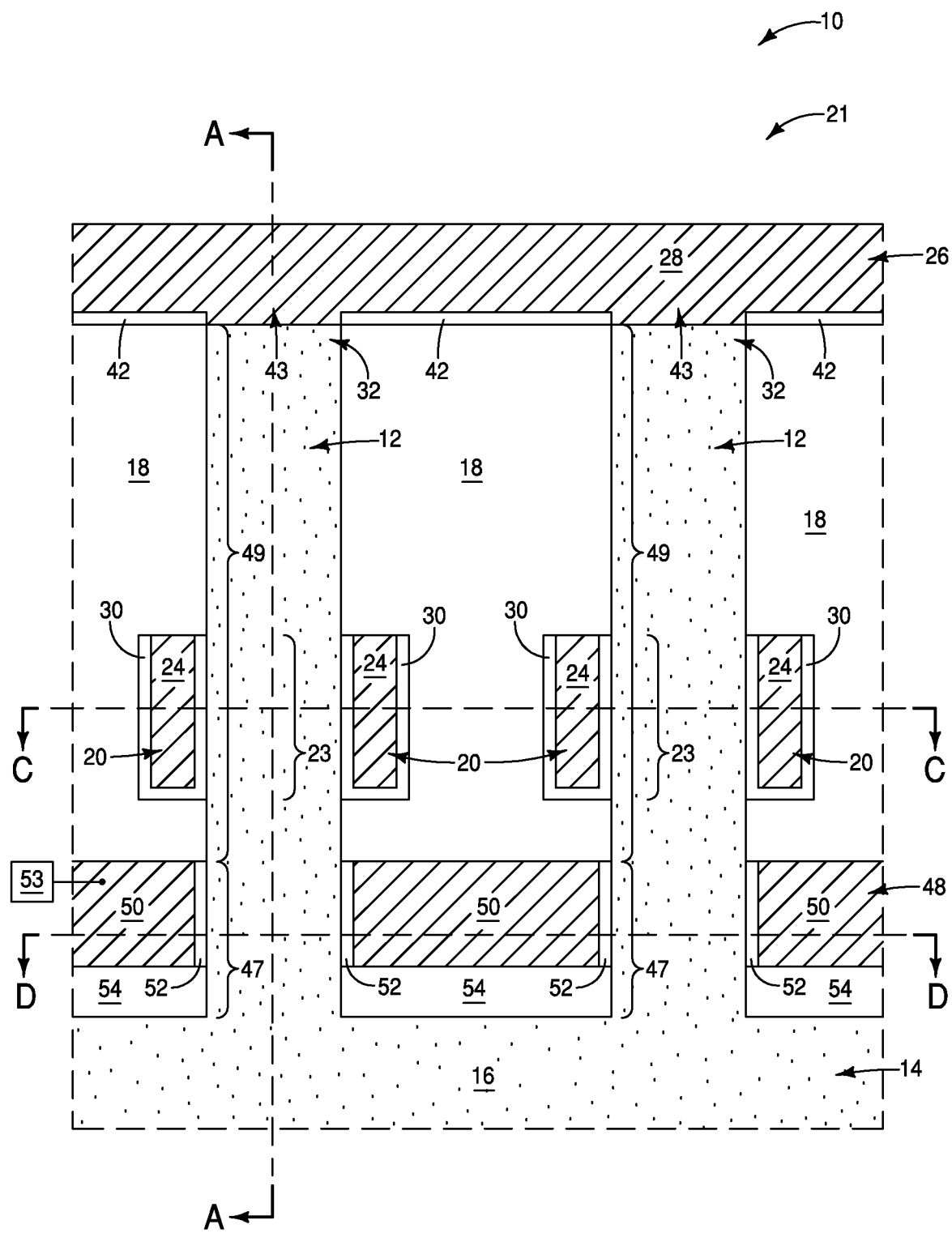
Figure 1C:
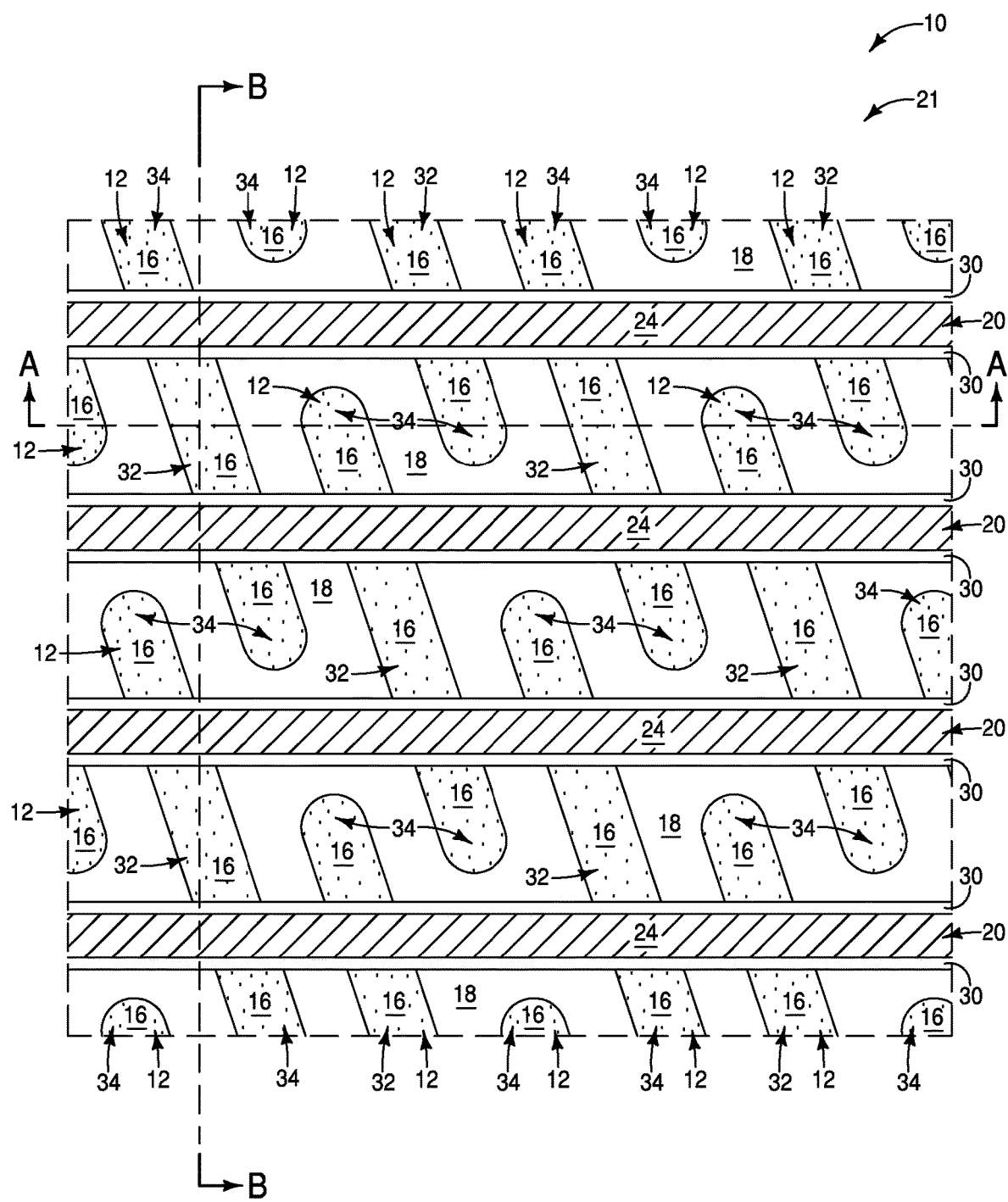
Figure 1D:
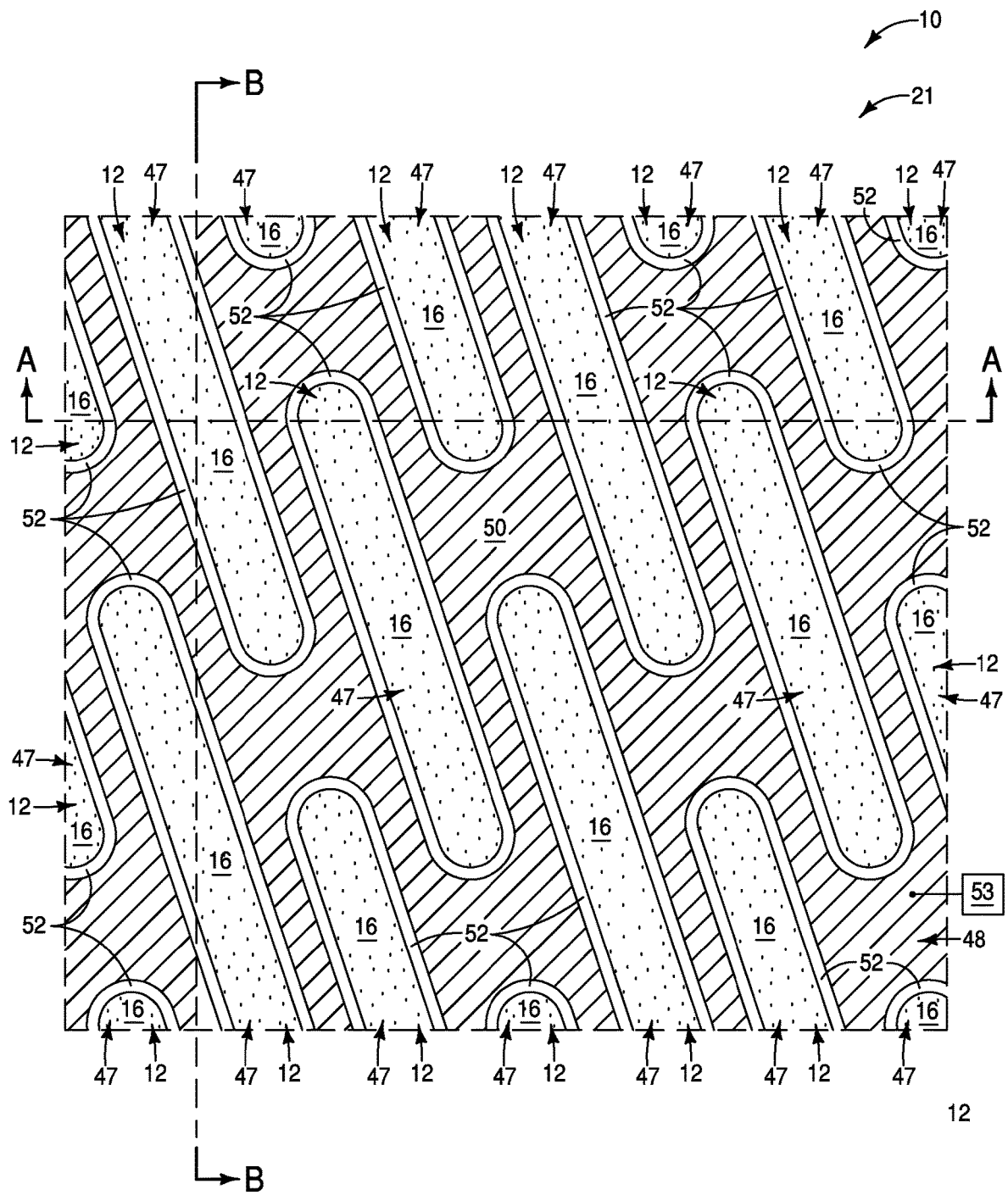

Referring to FIGS. 1-1D, a portion of an example integrated assembly 10 is illustrated. Such assembly may be formed with any suitable methodology. The assembly 10 includes a plurality of active regions 12 (also referred to herein as active-region-pillars) extending upwardly from a semiconductor base 14. All of the active regions 12 may be substantially identical to one another; with the term "substantially identical" meaning identical to within reasonable tolerances of fabrication and measurement. The active regions 12 are illustrated with dashed lines (phantom view) in FIG. 1 to indicate that they are under other materials.

The active regions 12 and semiconductor base 14 comprise semiconductor material 16. Such semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 16 may comprise, consist essentially of, or consist of appropriately-doped silicon. The silicon may be in any suitable form; and in some embodiments may be monocrystalline silicon. In some embodiments, the semiconductor material 16 of the active regions may be referred to as active-region-material.

The base 14 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The active regions 12 are spaced from one another by intervening regions, and insulative material 18 is within the intervening regions. The insulative material 18 may comprise any suitable composition(s); and in some embodiments may comprise, consist essentially of, or consist of silicon dioxide.

Wordlines (i.e., access lines) 20 extend along a first direction (represented by an x-axis). The first direction may correspond to a row direction of a memory array 21. The wordlines 20 are illustrated with dashed lines (phantom view) in FIG. 1 to indicate that they are under other materials.

The wordlines 20 comprise conductive material 24. The conductive material 24 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Digit-lines (i.e., sense-lines, bitlines) 26 extend along a second direction (represented by a y-axis). The second direction may correspond to a column direction of the memory array 21. The second direction (i.e., the column direction) may be orthogonal to the first direction (i.e., the row direction), or may simply cross the first direction.

The digit-lines 26 comprise conductive material 28. The conductive material 28 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The digit-line material 28 may be the same composition as the wordline material 24, or may be a different composition than the wordline material 24.

The wordlines are adjacent to the active-region-pillars 12. Gate dielectric material 30 extends around lower regions of the wordlines 20, and is between the wordlines and the active regions 12. The gate dielectric material 30 may comprise any suitable composition(s); and in some embodiments may comprise, consist essentially of, or consist of silicon dioxide.

Each of the active regions (i.e., active-region-pillars) 12 may be considered to comprise a digit-line-contact-region 32 between a pair of storage-element-contact-regions 34. In some embodiments, the regions 32 and 34 may be generically referred to as contact regions.

The wordlines 20 comprise transistor gates which gatedly couple the storage-element-contact-regions 34 with the digit-line-contact-regions 32.

The wordlines 20 are adjacent channel regions 23 (shown in FIG. 1B, and further described below with reference to FIG. 2) within the active-region-pillars 12. The channel regions 23 extend between digit-line-contact-regions 32 and storage-element-contact-regions 34, as described in more detail below with reference to FIG. 2.

Referring still to FIGS. 1-1D, the digit-line-contact-regions 32 are electrically coupled with the digit-lines 26. In the illustrated embodiment, insulative material 42 (FIGS. 1A and 1B) is provided under the digit-lines 26, and conductive interconnects 43 extend through holes in the insulative material 42 to couple with the digit-line-contact-regions 32. Insulative spacers 44 extend along sidewalls of the digit-lines 26. The insulative spacers 44 and insulative material 42 may comprise any suitable compositions; including, for example, silicon dioxide, silicon nitride, etc. The insulative spacers 44 and insulative material 42 may comprise a same composition as one another, or may comprise different compositions than one another. The interconnects 43 may comprise a same composition as the digit-lines 26, or may comprise a different composition relative to the digit lines.

The storage-element-contact-regions 34 are coupled with storage-elements 36. The illustrated example storage-elements 36 are configured as capacitors. Each of the capacitors 36 has a node connected with a reference voltage 37. The reference voltage may be ground or any other suitable voltage. In some embodiments, other storage-elements may be utilized instead of the capacitors 36. Any suitable device having two or more detectable states may be utilized as a storage-element; including, for example, devices comprising phase change material, conductive-bridging material, etc.

In the illustrated embodiment, the storage-elements 36 are electrically coupled to the storage-element-contact-regions 34 through conductive interconnects 38. The conductive interconnects 38 comprise conductive material 40. The conductive material 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The digit-lines 26 are electrically isolated from the interconnects 38 by the insulative spacers 44 and the insulative material 42 (as shown in FIGS. 1 and 1A).

Insulative panels 46 (FIG. 1) are provided between neighboring interconnects 38 to electrically isolate the neighboring interconnects from one another.

The active-region-pillars 12 may be considered to comprise lower portions 47 (FIGS. 1A and 1B), and upper portions 49 over the lower portions.

A conductive structure 48 is adjacent the lower portions 47 of the active-region pillars 12, and surrounds such lower portions of the active-region pillars (as shown in FIG. 1D). In some embodiments, the conductive structure 48 may be considered to extend throughout intervening regions between the active-region-pillars 12.

The conductive structure 48 comprises conductive material 50. The conductive material 50 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 50 may comprise p-type silicon and/or one or more metals (e.g., one or more of titanium, titanium nitride, tungsten, tungsten nitride and ruthenium). The conductive material 50 may comprise a same composition as the wordline material 24, or may comprise a different composition than the wordline material. In some embodiments, one of the conductive materials 24 and 50 may be referred to as a first conductive material, and the other may be referred to as a second conductive material.

The conductive material 50 is spaced from the active-region-pillars 12 by intervening dielectric material 52. The dielectric material 52 may comprise any suitable composition(s); including, for example, one or more of silicon oxide, aluminum oxide, hafnium oxide, zirconium oxide, silicon nitride, etc. In some embodiments, the dielectric material 52 may comprise a same composition as the dielectric material 30, and in other embodiments may comprise a different composition than the dielectric material 30. In some embodiments, one of the dielectric materials 30 and 52 may be referred to as a first dielectric material, and the other may be referred to as a second dielectric material.

The conductive structure 48 is coupled with a voltage source 53. In operation, the voltage source provides voltage to the conductive structure 48 sufficient for the conductive structure to a electrostatically induce a desired threshold voltage along the channel regions (as discussed in more detail below with reference to FIG. 3). In some embodiments, the structure 48 may be referred to as a threshold-voltage-inducing-structure. The conductive material 50 of the conductive structure 48 may function as gate material during operation of the structure, and in some embodiments may be referred to as conductive gate material (or conductive-gate-material).

The conductive structure 48 is supported by an insulative material 54. The insulative material 54 may comprise any suitable composition(s); and in some embodiments may comprise, consist essentially of, or consist of silicon dioxide.

Figure 2:
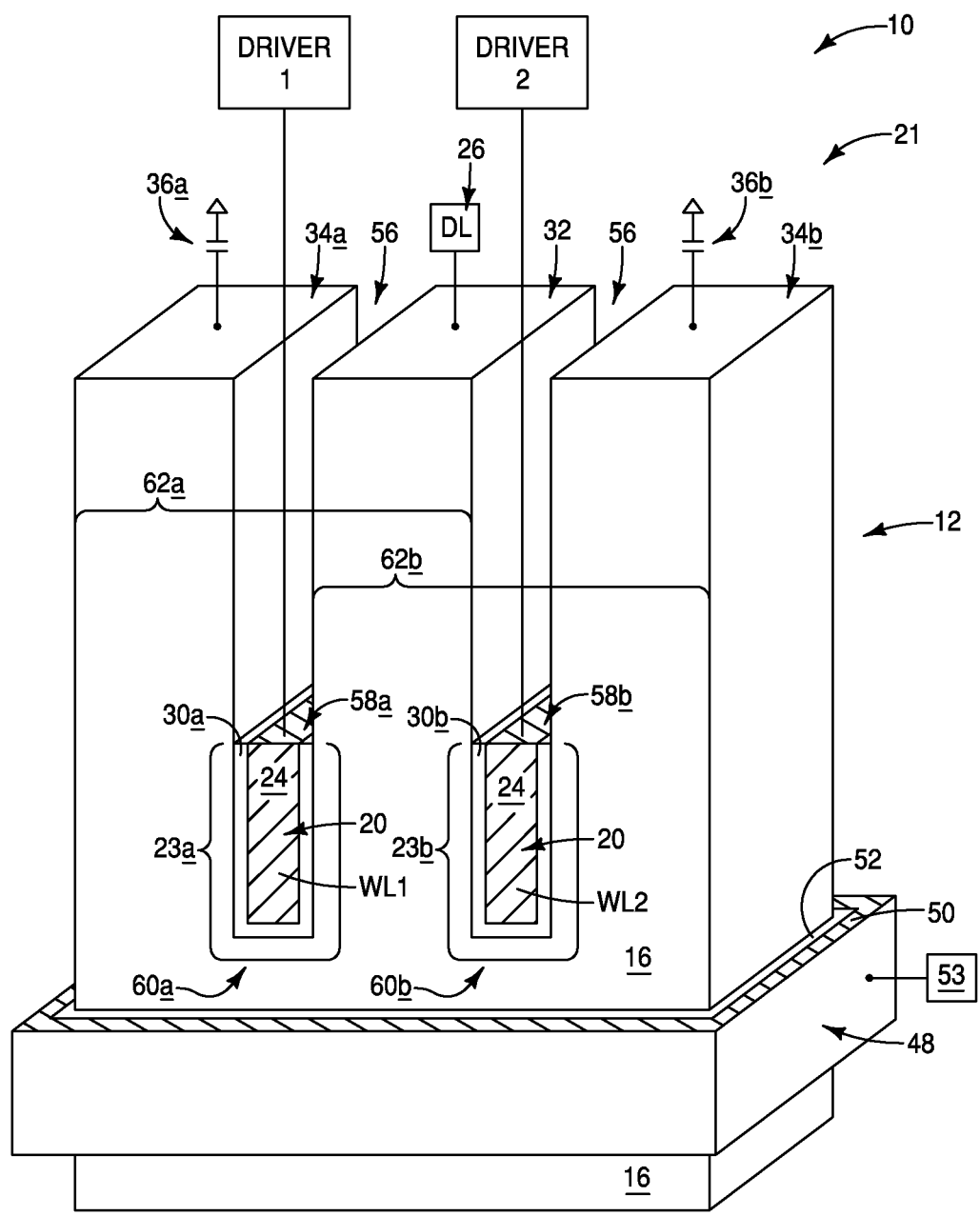
FIG. 2 is a diagrammatic three-dimensional view of a region of an example integrated assembly comprising example memory cells.

FIG. 2 shows one of the active-region-pillars 12 of construction 10 in isolation from the other pillars, and illustrates the arrangement of the wordlines 20 and the conductive structure 48 relative to the illustrated pillar 12.

The pillar comprises a first storage-element-contact-region 34a, a second storage-element-contact-region 34b, and a digit-line-contact-region 32 between the storage-element-contact-regions 34a and 34b. The digit-line-contact-region 32 is coupled with a digit-line (DL) 26, and the storage-element-contact-regions 34a and 34b are coupled with first and second storage-elements 36a and 36b (with such storage elements being illustrated as capacitors in the shown embodiment).

The wordlines 20 are within trenches 56 that extend into the pillar 12. One of the wordlines is labeled as WL1, and the other is labeled as WL2. The wordlines WL1 and WL2 are proximate first and second channel regions 23a and 23b, respectively; with such channel regions being within the semiconductor material 16, and being shown to be within first and second portions 60a and 60b of the of the pillar 12. The wordline WL1 comprises a gate region 58a adjacent the first portion 60a, and configured to gatedly couple the digit-line-contact-region 32 with the storage-element-contact-region 34a by inducing an electric field within the first channel region 23a; and the wordline WL2 comprises a gate region 58b adjacent the second portion 60b, and configured to gatedly couple the digit-line-contact-region 32 with the storage-element-contact-region 34b by inducing an electric field within the second channel region 23b. The wordline WL1 is spaced from the semiconductor material 16 of the active-region-pillar 12 by gate dielectric material 30a, and the wordline WL2 is spaced from the semiconductor material 16 of the active-region-pillar 12 by gate dielectric material 30b.

The pillar 12 comprises two memory cells 62a and 62b of the memory array 21. The memory cell 62a includes the storage-element 36a, the gate portion 58a of the wordline WL1, and the digit-line-contact-region 32. The memory cell 62b includes the storage-element 36b, the gate portion 58b of the wordline WL2, and the digit-line-contact-region 32. The memory cells are labeled as 62a and 62b so that they may be distinguished from one another, but may be considered to be generally representative of a large number of substantially identical memory cells 62 within the memory array 21; where the term "substantially identical" means identical to within reasonable tolerances of fabrication and measurement.

Each of the wordlines is electrically coupled with a wordline driver (illustrated as driver 1 and driver 2). In operation, the wordline drivers are utilized to provide desired voltage along the wordlines WL1 and WL2 sufficient to induce current flow along the channel regions 23a and 23b during read/write operations associated with the memory cells 62a and 62b.

The conductive structure 48 comprises the conductive material 50 wrapping around a lower portion of the active-region-pillar 12. The dielectric material 52 is between the conductive material 50 and the semiconductor material 16 of the active-region-pillar 12. In some embodiments, the dielectric material 52 may referred to as first dielectric material, the gate dielectric material 30a may be referred to as second dielectric material, and the gate dielectric material 30b may be referred to as third dielectric material. The second and third dielectric materials 30a and 30b comprise a same composition as one another, and the first dielectric material 52 comprises a composition which may or may not be the same as the composition of the second and third dielectric materials 30a and 30b. In some embodiments, the composition of the dielectric material 52 may be referred to as a first dielectric composition, and the composition of the dielectric materials 30a and 30b may be referred to as a second dielectric composition.

In operation, voltage is applied along the conductive structure 48 to induce a desired threshold voltage within the channel regions 23a and 23b. The utilization of the conductive structure 48 for inducing the threshold voltage may eliminate the prior art need for providing dopant within the channel regions for inducing the threshold voltage. Accordingly, in some embodiments memory cells (e.g., DRAM cells) may have channel regions with little, if any, boron therein; and in some embodiments there may be no detectable boron within such channel regions (or at least a boron concentration less than about $1 \times 10^{14}$ atoms/cm$^3$ within the channel regions). In some embodiments, the conductive structure 48 may be referred to as a bottom electrode (or simply as an electrode). The voltage applied to the electrode 48 by the voltage source 53 may be any suitable voltage; and in some embodiments may be constant (ground or any other suitable potential), or may vary depending on DRAM operation.

Figure 3:
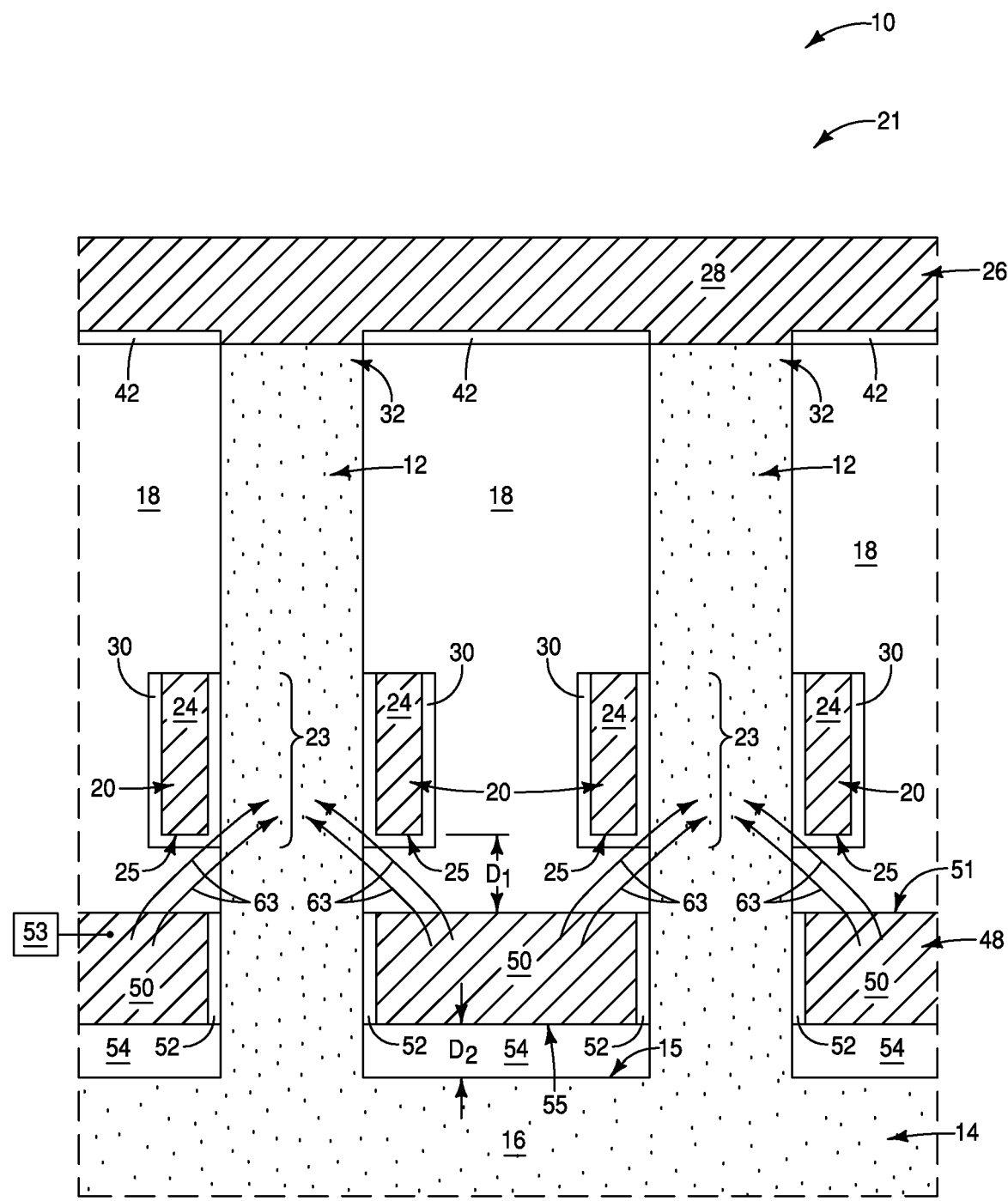
FIG. 3 is a diagrammatic cross-sectional side view of a region of an example integrated assembly, and is along a same cross-section as FIG. 1B.

FIG. 3 shows a cross-section analogous to that described above with reference to FIG. 1B, and diagrammatically illustrates a mechanism by which the threshold-voltage-inducing-structure 48 may be utilized to induce a desired voltage along the channel regions 23 within the second material 16 of active-region-pillars 12. Specifically, the voltage source 53 is utilized to provide voltage along the conductive gate material 50 which induces an electric field (diagrammatically illustrated with flux lines 63). The electric field extends to the channel regions 23 and thereby modifies the threshold voltage within the channel regions to provide the desired threshold voltage for operation of memory cells (e.g., the memory cells 62 described above with reference to FIG. 2) within the memory array 21. The desired threshold voltage may be any suitable threshold voltage for operation of memory cells within the memory array 21; and in some embodiments may have an absolute value within a range of from greater than 0 volts to less than or equal to about 3 volts (i.e., may be within a range of from at least about −3 volts to less than or equal to about +3 volts).

The conductive structure 48 may be kept relatively close to the wordlines 20 so that the electric field generated by current flow along the conductive material 50 penetrates into the channel regions 23. In some embodiments, a distance $D_1$ between lower surfaces 25 of the wordlines 20 and an upper surface 51 of the conductive material 50 is within a range of from about 1 nanometer (nm) to about 40 nm.

The conductive structure 48 may be at any suitable elevation above the base 14 of the semiconductor material 16. In some embodiments, the insulative material 54 may be considered to be an insulative film; and such insulative film may have a thickness within a range of from about 1 nm to about 100 nm (i.e., a distance $D_2$ from an upper surface 15 of the base 14 to a lower surface 55 of the structure 48 may be within a range of from about 1 nm to about 100 nm).

Figure 4:
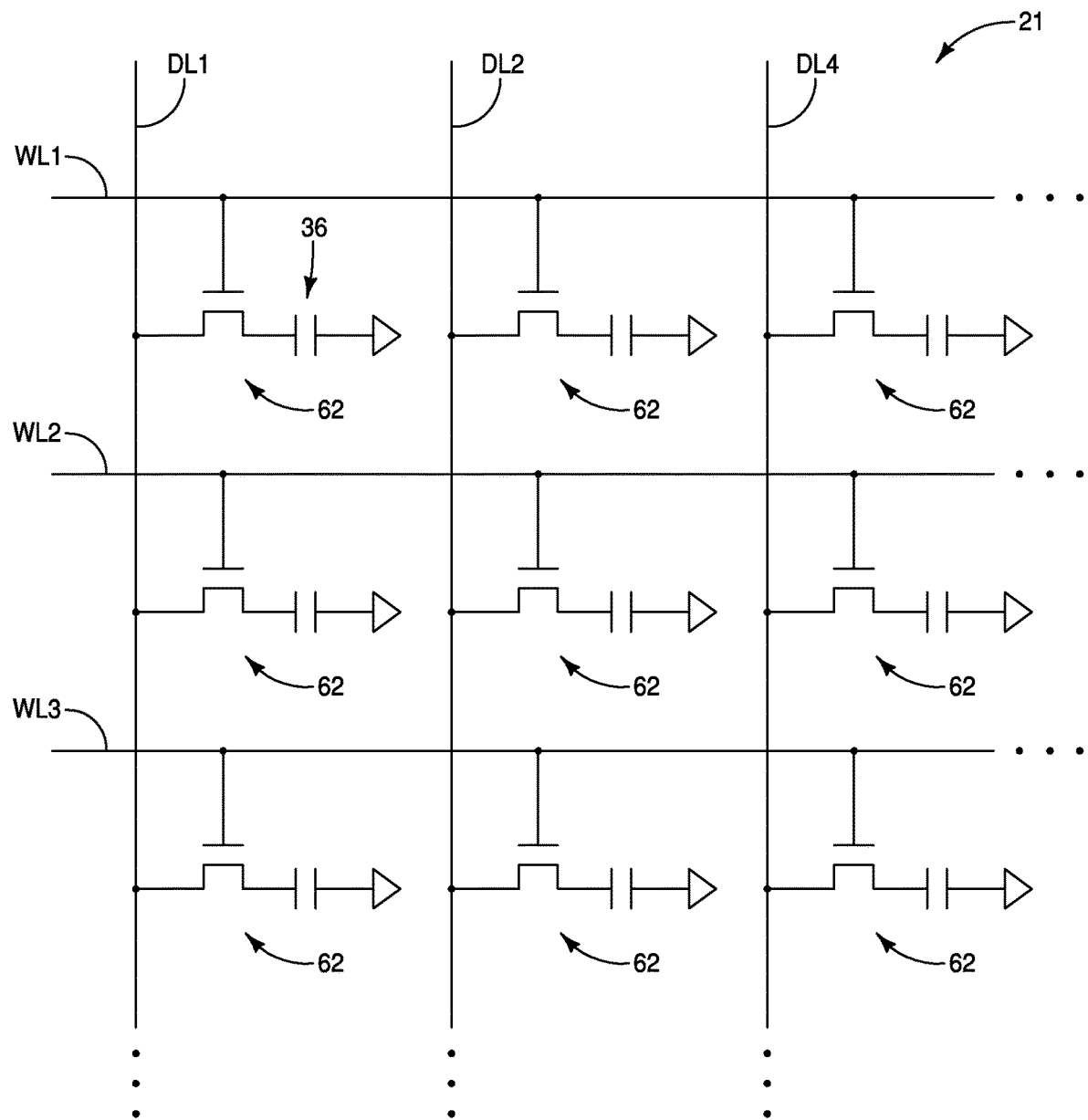
FIG. 4 is a diagrammatic schematic view of a region of an example memory array.

The memory array 21 of FIGS. 1-3 may have any suitable configuration, and in some embodiments may be a DRAM array. An example DRAM array 21 is schematically illustrated in FIG. 4. The DRAM array 21 includes digit-lines (DL1-DL3) corresponding to the digit-lines 26, and includes wordlines (WL1-WL3) corresponding to the wordlines 20. Memory cells 62 comprise transistors coupled with the capacitors 36. Each of the memory cells 62 is uniquely addressed through the combination of a wordline and a digit-line.

Figure 5:
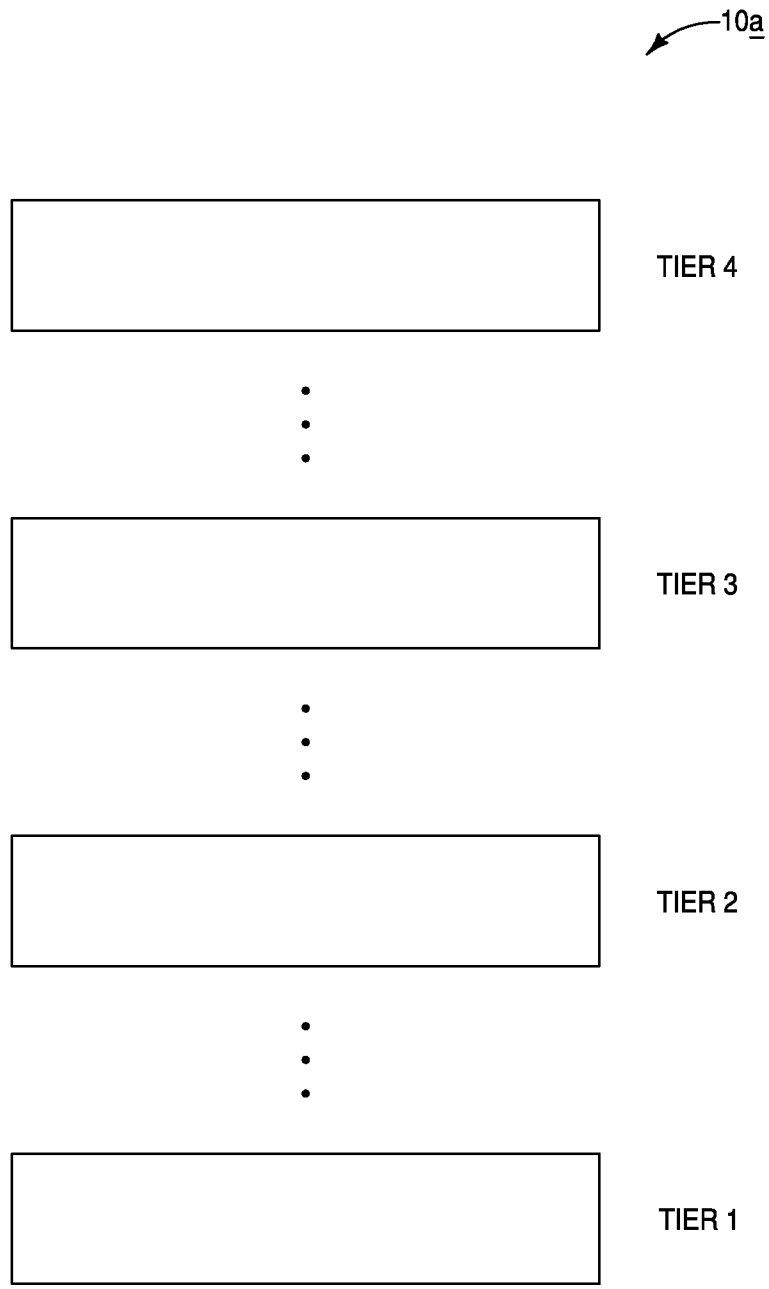
FIG. 5 is a diagrammatic cross-sectional side view of a region of an example assembly comprising stacked tiers.

In some embodiments, the memory array 21 may be within a memory tier (i.e., memory deck) which is within a vertically-stacked arrangement of tiers (or decks). For instance, FIG. 5 shows a portion of an integrated assembly 10a comprising a vertically-stacked arrangement of tiers 1-4. The vertically-stacked arrangement may extend upwardly to include additional tiers. The tiers 1-4 may be considered to be examples of levels that are stacked one atop the other. The levels may be within different semiconductor dies, or at least two of the levels may be within the same semiconductor die.

Individual tiers may include control circuitry and/or sensing circuitry (e.g., may include wordline drivers, sense amplifiers, etc.); and/or may include memory arrays, such as, for example, the memory array 21. The memory arrays within the various tiers may be the same as one another (e.g., may all be DRAM arrays), or may be different relative to one another (e.g., some may be DRAM arrays, while others are NAND arrays).

Figure 6:
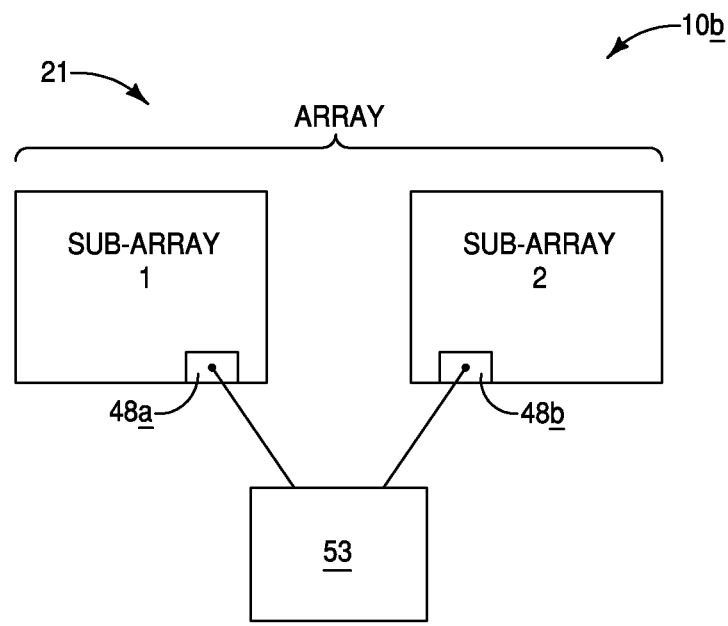
FIGS. 6 and 7 are diagrammatic schematic views of a region of a memory array comprising two subarrays.
Figure 7:
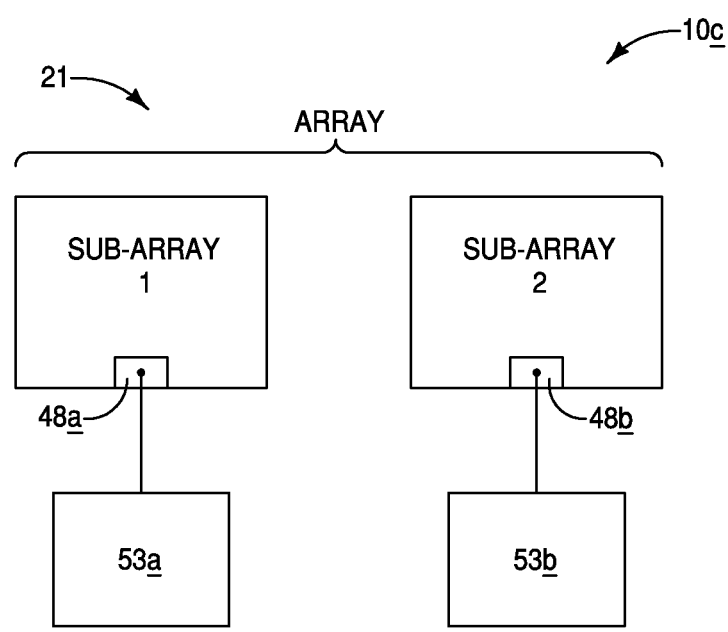

In some applications, a memory array may be subdivided amongst two or more subarrays (also spelled "sub-arrays" in some applications). Each of the subarrays may comprise, for example, memory cells substantially identical to the memory cells 62 described above with reference to FIG. 2, and may comprise configurations analogous to the configuration described above with reference to FIGS. 1-1D. The subarrays may be operated independently of one another so that one or more of the subarrays is subjected to operations (e.g., read/write operations) while one or more others of the subarrays are resting (i.e., are not being subjected to operations). FIGS. 6 and 7 show example arrangements of the reference voltage 53 relative to subarrays.

FIG. 6 shows an integrated assembly 10b having an array 21 subdivided amongst a pair of subarrays (labeled as subarray 1 and subarray 2). Each of the subarrays comprises a threshold-voltage-inducing-structure analogous to the structure 48 described above with reference to FIGS. 1-3; with subarray 1 comprising a first structure 48a, and subarray 2 comprising a second structure 48b. The structures 48a and 48b are electrically coupled to the same voltage source 53 and are continuously held at the same level in order to maintain static threshold voltage throughout channel regions (e.g., the channel regions 23a and 23b described with reference to FIG. 2) within the subarrays 1 and 2. The voltage provided by the voltage source 53 may be any suitable voltage; including, for example, a voltage less than or equal to Vcc, or a voltage greater than Vcc (with example voltages being within a range of from at least about −10 volts to less than or equal to about +10 volts).

FIG. 7 shows an integrated assembly 10c which is similar to the assembly 10b of FIG. 6, except that the structure 48a of subarray 1 is coupled with a first voltage source 53a and the structure 48b of subarray 2 is coupled with a second voltage source 53b. The voltage sources 53a and 53b may be operated independently of one another. In some embodiments, the voltage sources may be operated to provide different voltage to the structures 48a and 48b depending on whether the subarrays 1 and 2 are being utilized in addressing operations (i.e., are involved in read/write operations), or are in a resting mode. Accordingly, a different threshold voltage may be provided to memory cells (e.g., memory cells 62 of FIG. 2) of a subarray when the subarray is in a resting mode as opposed to when the subarray is in another operational mode other than the resting mode. Thus, in some applications the threshold-voltage-inducing-structure 48 may be operated to dynamically adjust the threshold voltage of channel regions (e.g., channel regions 23 of FIG. 2) to adapt for different operational modes of the channel regions. In other words, the threshold-voltage-inducing-structure 48 may be utilized to vary (i.e., modify) threshold voltage within channel regions (e.g., the channel regions 23 of FIG. 2) of memory cells (e.g., the memory cells 62 of FIG. 2) to adjust the threshold voltage for different operational modes of the channel regions.

The embodiments of FIGS. 6 and 7 illustrate that the voltages on conductive structures 48a and 48b of the different subarrays may be different relative to one another, or may be the same as one another. Also, the voltage may change on different subarrays in transitioning from one operational mode to another, or during a continuing operational mode, which may be utilized for, for example, power/refresh management.

The memory arrays described above may be formed with any suitable processing. Example processing which may be utilized to form the array 21 of FIGS. 1-1D is described with reference to FIGS. 8-14.

Figure 8:
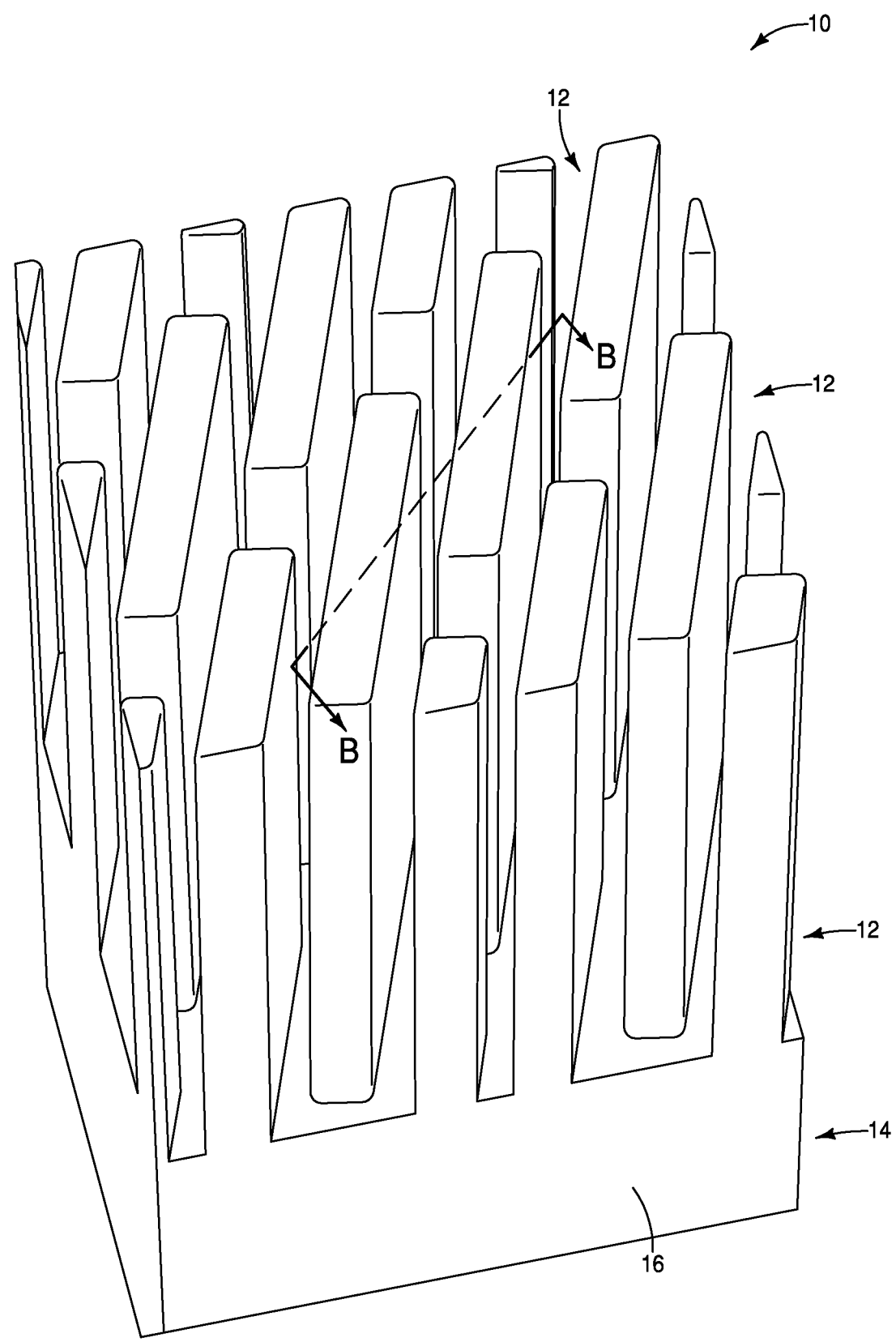
FIG. 8 is a diagrammatic three-dimensional view of a region of an example integrated assembly at an example initial process stage.

Referring to FIG. 8, the integrated assembly (construction) 10 is shown at an initial process stage after the semiconductor material 16 has been patterned to form the pillars 12 (only some of which are labeled) extending upwardly from the base 14.

Figure 9:
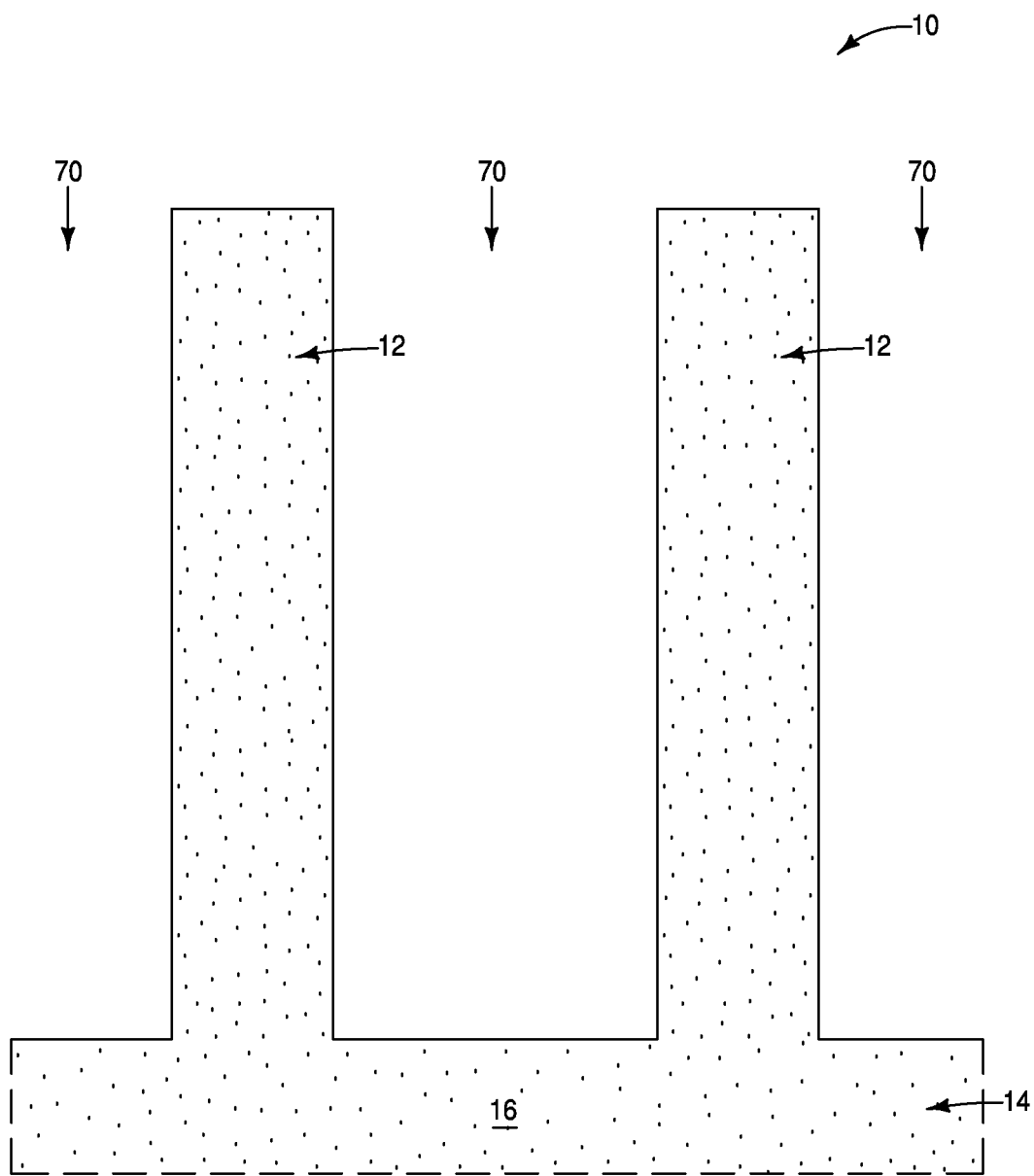
FIG. 9 is a diagrammatic cross-sectional side view of the integrated assembly of FIG. 8 along the line B-B of FIG. 8.

FIG. 9 shows construction 10 at the same process stage as FIG. 8, and shows a cross-section along the line B-B of FIG. 8. The cross-section of FIG. 9 is along an analogous plane to that utilized for the cross-section of FIG. 1B. The cross-section of FIG. 9 comprises the pillars 12, with such pillars being spaced from one another by intervening regions 70.

Figure 10:
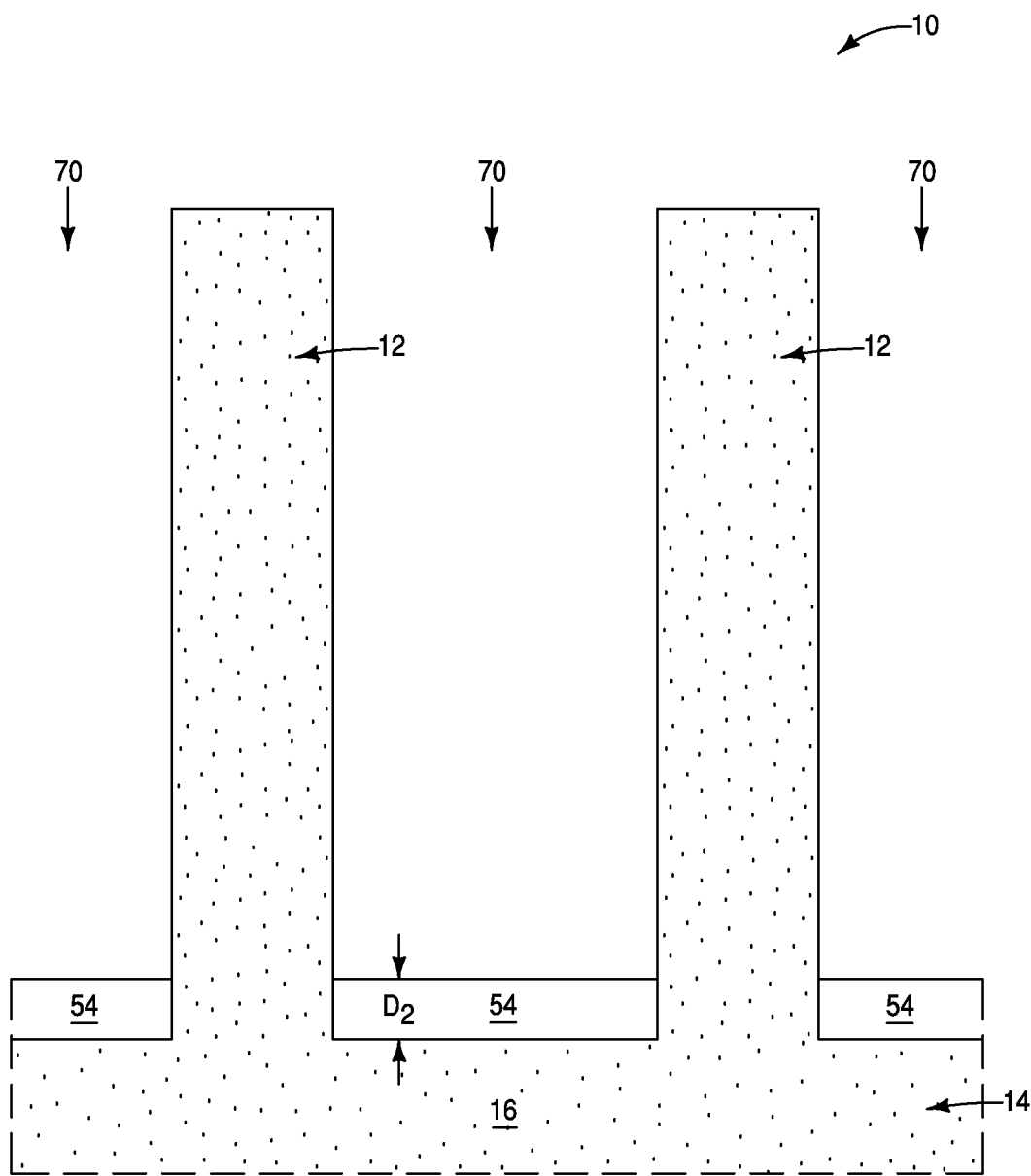
FIGS. 10-14 are diagrammatic cross-sectional side views of the integrated assembly of FIG. 9 at process stages following the process stage of FIG. 9 in accordance with an example method for fabricating an example memory array.

Referring to FIG. 10, the insulative material 54 is formed over the base 14 to provide an insulative film along an upper surface of the base. The insulative material 54 is formed to the thickness $D_2$ described above with reference to FIG. 3. The insulative material 54 may be formed with any suitable processing. For instance, the insulative material 54 may be deposited within the intervening regions 70 utilizing one or more of atomic layer deposition (ALD), chemical vapor deposition (CVD), physical vapor deposition (PVD), etc.

Figure 11:
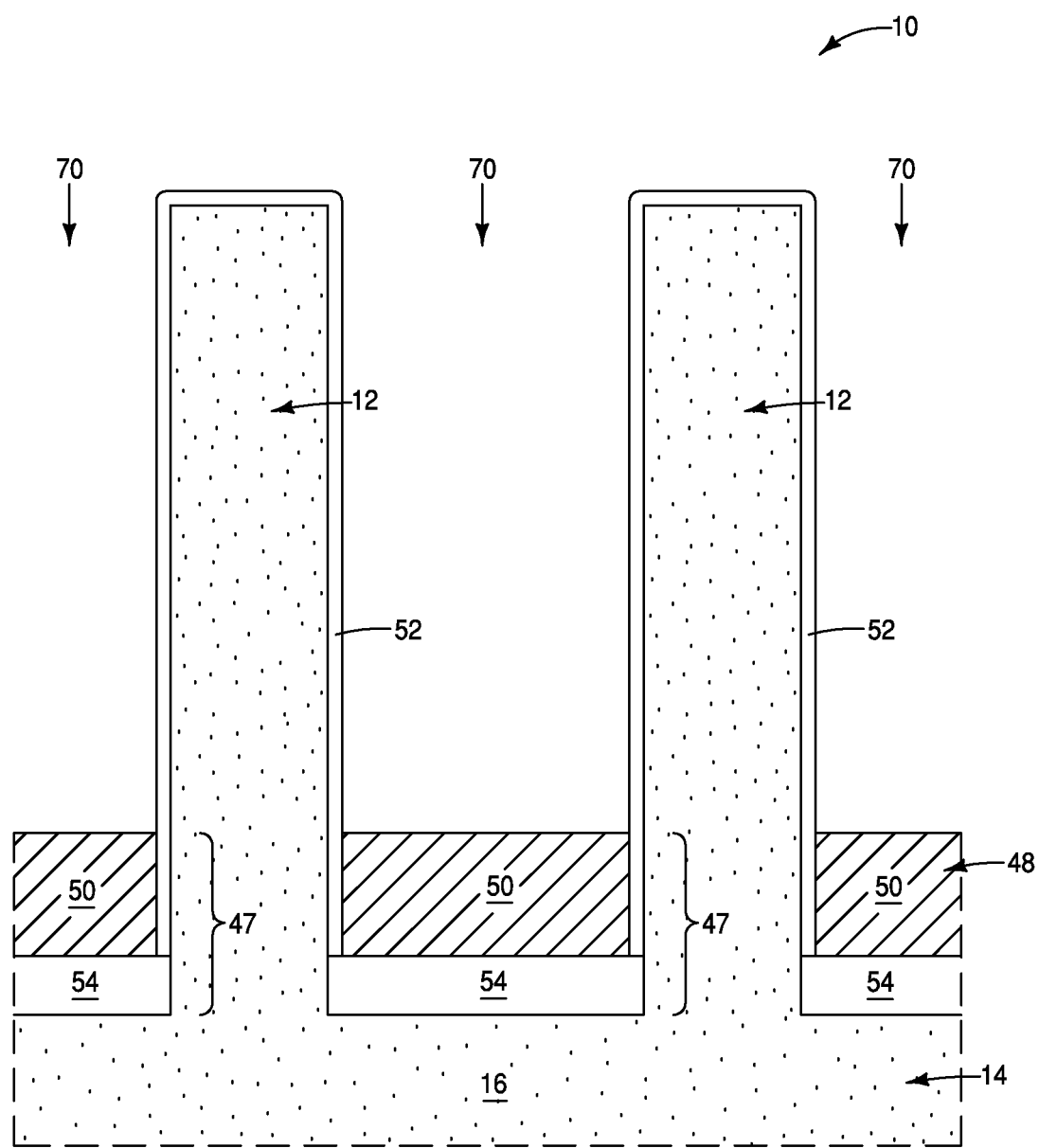

Referring to FIG. 11, the first dielectric material 52 is formed along exposed surfaces of the pillars 12, and then the first conductive material 50 is formed over the insulative material 54 and adjacent the dielectric material 52. The insulative material 54, dielectric material 52 and conductive material 50 surround the lower regions 47 of the pillars 12.

The dielectric material 52 may be formed with any suitable processing, including, for example, one or more of ALD, CVD and PVD, oxidation of exposed surfaces of pillars 12, etc.

The conductive material 50 may be formed with any suitable processing, including, for example, one or more of ALD, CVD, PVD, etc. In some embodiments, the conductive material 50 may be formed to a thickness greater than the desired final thickness of the conductive material, and may then be etched back to the desired final thickness.

Figure 12:
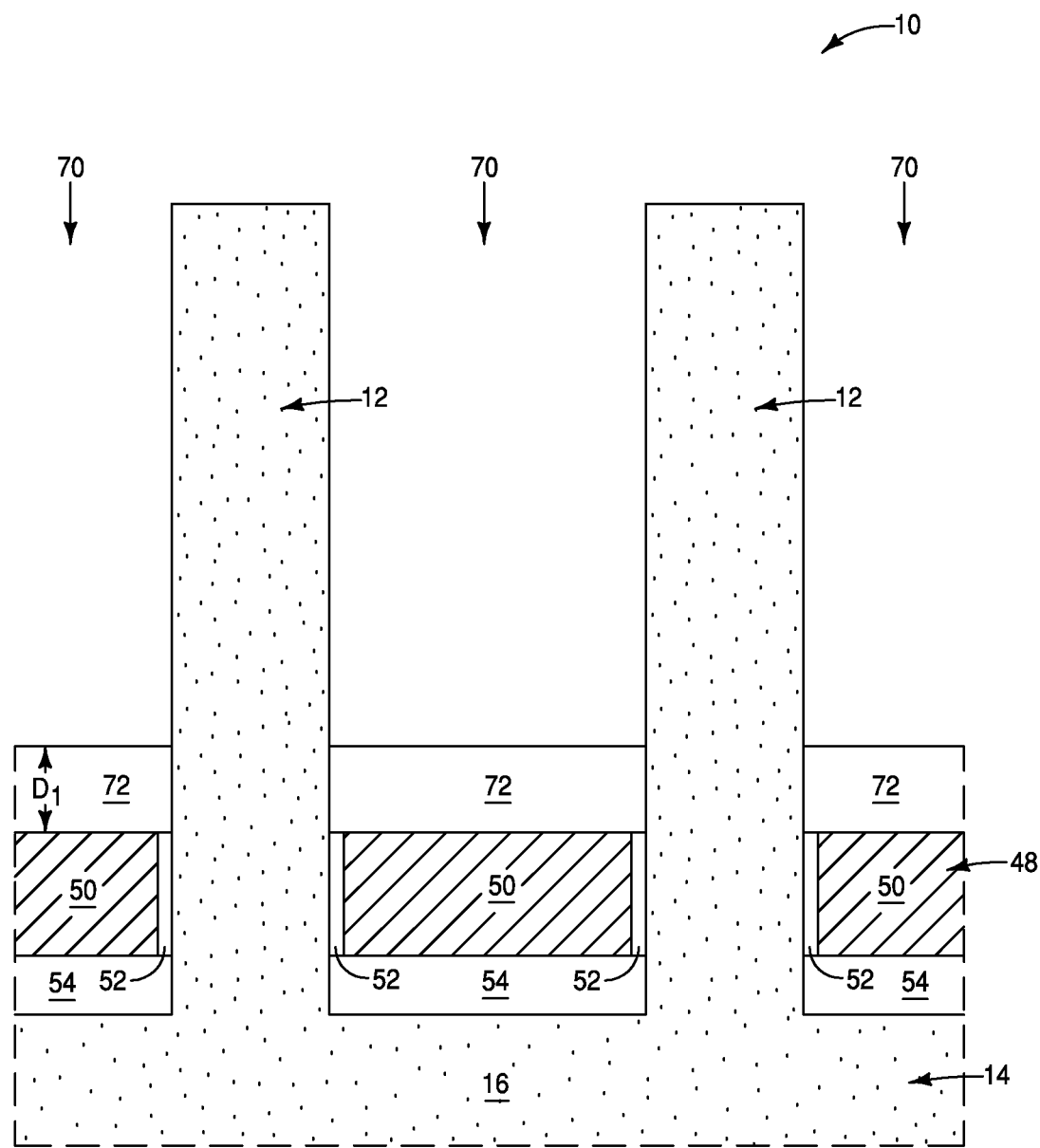

Referring to FIG. 12, insulative material 72 is formed over the conductive material 50. The insulative material 72 is formed to the thickness $D_1$ described above with reference to FIG. 3. In the shown embodiment, the dielectric material 52 is removed from upper regions of the pillars 12 prior to forming the insulative material 72. In other embodiments, at least some of the dielectric material 52 may remain along upper portions of the pillars 12 at the process stage of FIG. 12.

Figure 13:
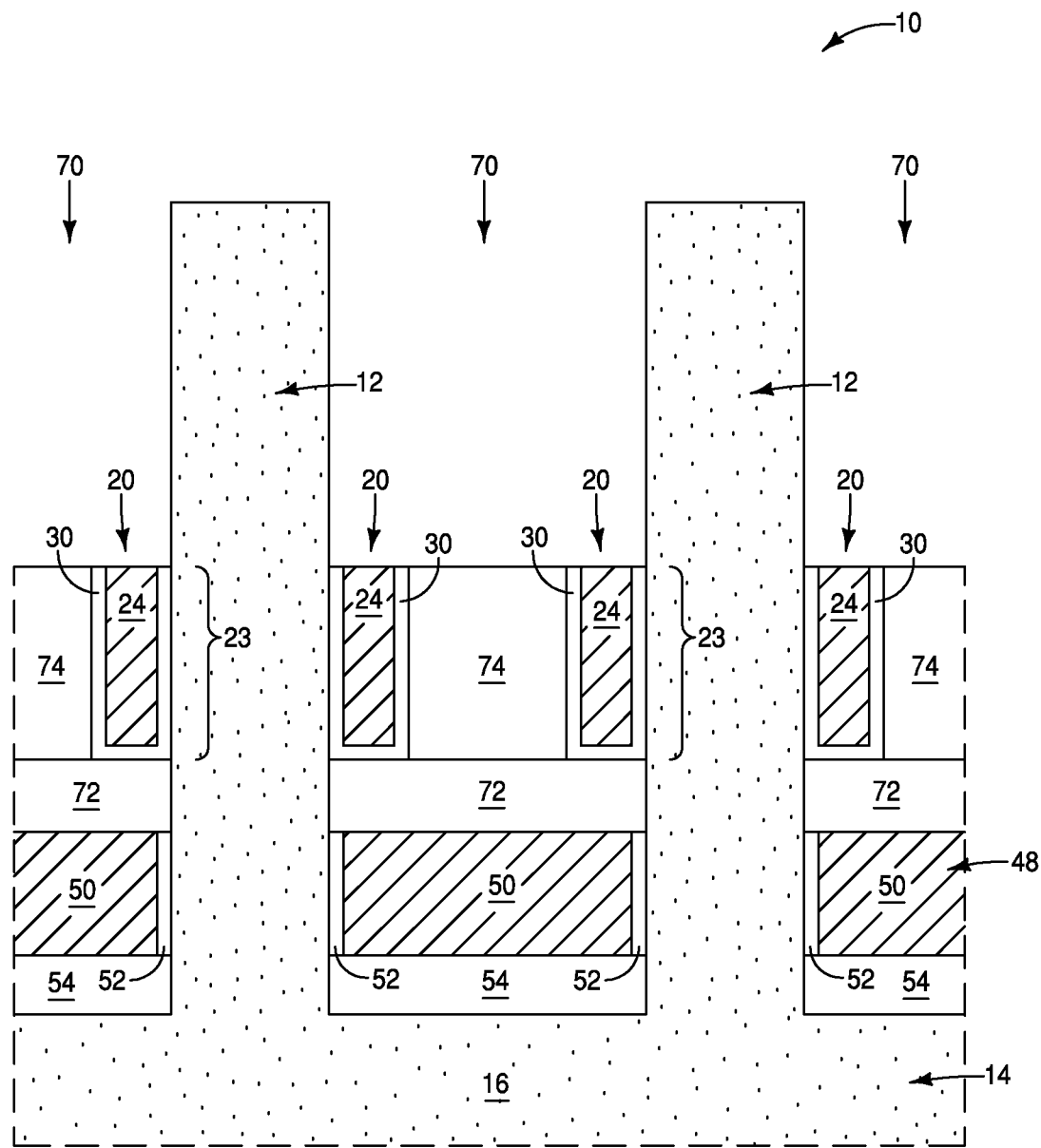

Referring to FIG. 13, the second dielectric material 30 is formed along portions of the pillars 12 over the insulative material 72, and the wordlines 20 are formed along the second dielectric material 30. The wordlines 20 comprise the second conductive material 24.

The dielectric material 30 and conductive material 24 may be formed with any suitable processing; including, for example, one or more of ALD, CVD, PVD, etc.

An additional insulative material 74 is provided within the intervening regions 70 and over the insulative material 72. The insulative materials 72 and 74 may comprise a same composition; and in some embodiments may both comprise silicon dioxide.

Portions of the pillars 12 proximate the wordlines 20 correspond to the channel regions 23 described above with reference to FIGS. 1-3.

The first and second dielectric materials 52 and 30 may comprise a same composition as one another, or may comprise different compositions relative to one another.

The first and second conductive materials 50 and 24 may comprise a same composition as one another, or may comprise different compositions relative to one another.

Figure 14:
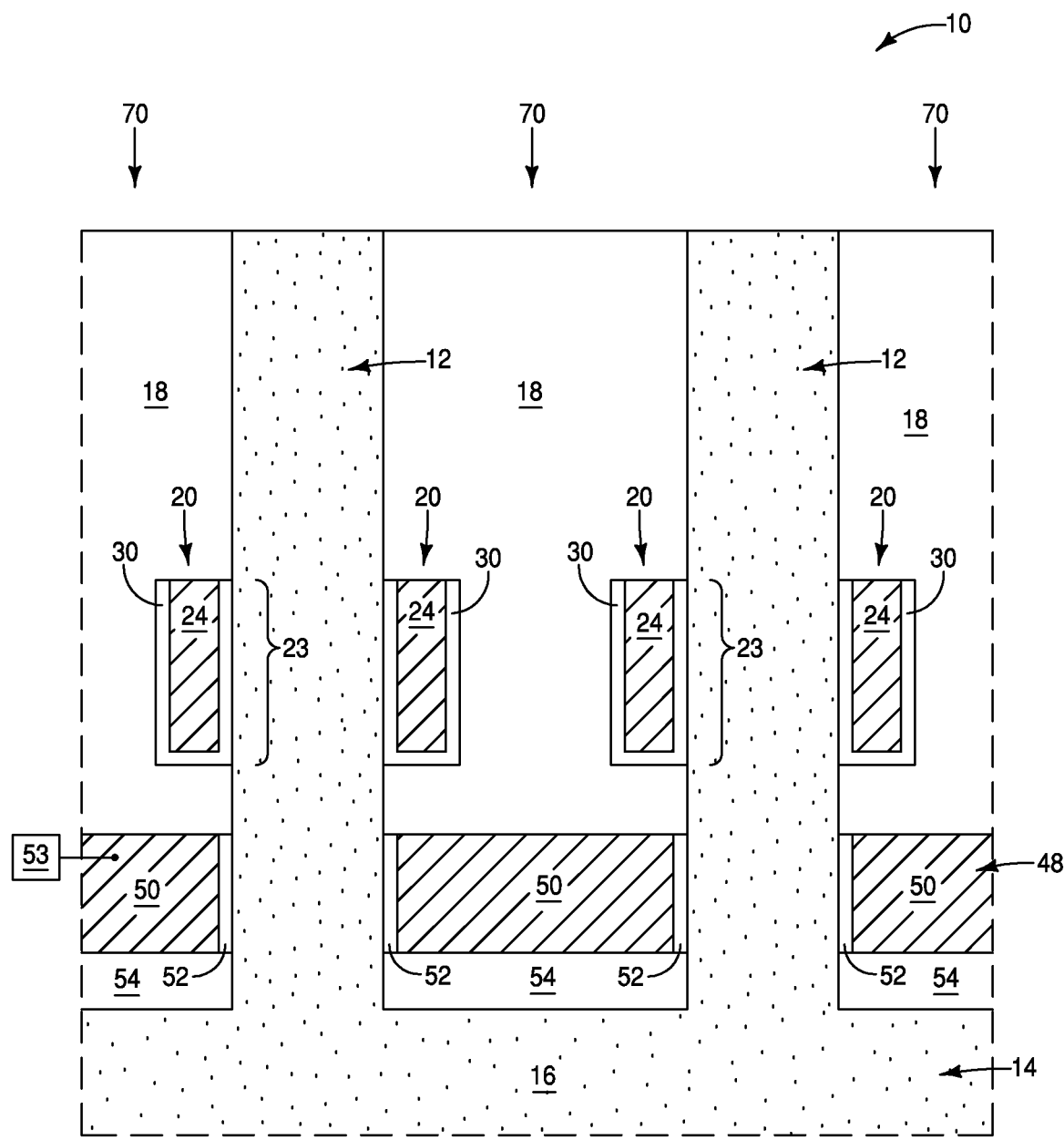

Referring to FIG. 14, the intervening regions 70 are filled with insulative material 18. In the embodiment of FIG. 14, the insulative materials 72 and 74 (FIG. 13) comprise a same composition as one another, and comprise the same composition as the material 18. Accordingly, the insulative materials 72 and 74 of FIG. 13 merge with one another, and merge with remainder of the insulative material 18.

The pillars 12 of FIG. 14 may correspond to active-region-pillars identical to those described above with reference to FIGS. 1-1D; and may each comprise a digit-line-contact region 32 (shown in FIG. 1) between a pair of storage-element-contact-regions (shown in FIG. 1). In subsequent processing, storage-elements 36 (shown in FIG. 1) may be coupled with the storage-element-contact regions, and digit-lines 26 (shown in FIG. 1) may be coupled with the digit-line-contact-regions to form memory cells 62 analogous to those of FIG. 2 within a memory array 21 analogous to that described above with reference to FIGS. 1-3.

The conductive material 50 corresponds to a conductive structure 48, and such conductive structure may be coupled with the voltage source 53. The coupling of the conductive structure 48 to the voltage source 53 may be conducted at any suitable process stage.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having an active-region-pillar extending upwardly from a base. The active-region-pillar includes a digit-line-contact-region between a first storage-element-contact-region and a second storage-element-contact-region. A threshold-voltage-inducing-structure is adjacent a lower portion of the active-region-pillar. A first channel region includes a first portion of the active-region-pillar between the digit-line-contact-region and the first storage-element-contact-region. A second channel region includes a second portion of the active-region-pillar between the digit-line-contact-region and the second storage-element-contact-region. A first wordline is adjacent the first portion of the active-region-pillar. A second wordline is adjacent the second portion of the active-region-pillar. A digit-line is coupled with the digit-line-contact-region. First and second storage-elements are coupled with the first and second storage-element-contact-regions. A voltage source is coupled with the threshold-voltage-inducing-structure. The voltage source provides voltage to the threshold-voltage-inducing-structure sufficient for the threshold-voltage-inducing structure to electrostatically induce a desired threshold voltage along the first and second channel regions.

Some embodiments include an integrated assembly comprising an active-region-pillar extending upwardly from a base. The active-region-pillar includes a digit-line-contact-region between a first storage-element-contact-region and a second storage-element-contact-region, and comprises semiconductor material. A conductive structure is adjacent a lower portion of the active-region-pillar. A first channel region comprises a first portion of the active-region-pillar between the digit-line-contact-region and the first storage-element-contact-region. A second channel region comprises a second portion of the active-region-pillar between the digit-line-contact-region and the second storage-element-contact-region. A first wordline is over the conductive structure and adjacent the first portion of the active-region-pillar. A second wordline is over the conductive structure and adjacent the second portion of the active-region-pillar. A digit-line is coupled with the digit-line-contact-region. First and second storage-elements are coupled with the first and second storage-element-contact-regions. A voltage source is coupled with the conductive structure. The conductive structure and voltage source are configured to provide a desired threshold voltage along the first and second channel regions.

Some embodiments include an integrated assembly comprising active-region-pillars extending upwardly from a base. Each of the active-region-pillars has contact regions associated therewith. The contact regions associated with each of the active-region-pillars includes a pair of storage-element-contact-regions, and includes a digit-line-contact-region between the storage-element-contact-regions of said pair. The active-region-pillars comprise silicon and are spaced from one another by intervening regions. A conductive structure is over the base and within the intervening regions. The conductive structure extends around lower portions of the active-region-pillars. Wordlines are adjacent the active-region-pillars. Regions of the active-region-pillars proximate the wordlines are channel regions. Digit-lines are coupled with the digit-line-contact-regions. Storage-elements are coupled with the storage-element-contact-regions. A voltage source is coupled with the conductive structure. The conductive structure and voltage source are configured to provide a desired threshold voltage along the channel regions.

Some embodiments include a method of forming an integrated assembly. A construction is provided to have active-region-pillars extending upwardly from a base. The active-region-pillars and the base comprise a semiconductor material. First dielectric material is formed to surround lower portions of the active-region-pillars. A first conductive material is formed over the base and surrounding the lower portions of the active-region-pillars. The first dielectric material is between the lower portions of the active-region-pillars and the first conductive material. Insulative material is formed over the first conductive material. Second dielectric material is formed along portions of the active-region-pillars over the insulative material. Wordlines are formed over the insulative material and adjacent the active-region-pillars. The second dielectric material is between the active-region-pillars and the wordlines. The wordlines comprise second conductive material. Each of the active-region-pillars has a pair of storage-element-contact-regions, and has a digit-line-contact-region between the storage-element-contact-regions of said pair. Portions of the active-region-pillars proximate the wordlines are channel regions. Digit-lines are coupled with the digit-line-contact-regions. Storage-elements are coupled with the storage-element-contact-regions. The first conductive material is coupled with a voltage source. The first conductive material and voltage source are configured to provide a desired threshold voltage along the channel regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   an active-region-pillar extending upwardly from a base; the active-region-pillar including a digit-line-contact-region between a first storage-element-contact-region and a second storage-element-contact-region;
   a threshold-voltage-inducing-structure adjacent a lower portion of the active-region-pillar;
   a first channel region comprising a first portion of the active-region-pillar between the digit-line-contact-region and the first storage-element-contact-region;
   a second channel region comprising a second portion of the active-region-pillar between the digit-line-contact-region and the second storage-element-contact-region;
   a first wordline adjacent the first portion of the active-region-pillar;
   a second wordline adjacent the second portion of the active-region-pillar;
   a digit-line coupled with the digit-line-contact-region;
   first and second storage-elements coupled with the first and second storage-element-contact-regions; and
   a voltage source coupled with the threshold-voltage-inducing-structure; the voltage source providing voltage to the threshold-voltage-inducing-structure sufficient for the threshold-voltage-inducing structure to electrostatically induce a desired threshold voltage along the first and second channel regions.

2. The integrated assembly of claim 1 having the threshold-voltage-inducing-structure operated to maintain static threshold voltage along the first and second channel regions.

3. The integrated assembly of claim 1 having the threshold-voltage-inducing-structure operated to vary threshold voltage along the first and second channel regions.

4. The integrated assembly of claim 1 wherein the desired threshold voltage has an absolute value within a range of from greater than 0 volts to less than or equal to about 3 volts.

5. The integrated assembly of claim 1 wherein the active-region-pillar comprises one or more of silicon, germanium, III/V semiconductor material and semiconductor oxide.

6. The integrated assembly of claim 1 wherein the first and second storage-elements are first and second capacitors.

7. The integrated assembly of claim 1 wherein the threshold-voltage-inducing-structure includes conductive gate material spaced from the lower portion of the active-region-pillar by dielectric material.

8. The integrated assembly of claim 7 wherein the conductive gate material comprises p-type silicon.

9. The integrated assembly of claim 7 wherein the conductive gate material comprises one or more metals.

10. The integrated assembly of claim 7 wherein the conductive gate material comprises one or more of titanium, titanium nitride, tungsten, tungsten nitride and ruthenium.

11. An integrated assembly, comprising:
   an active-region-pillar extending upwardly from a base; the active-region-pillar including a digit-line-contact-region between a first storage-element-contact-region and a second storage-element-contact-region; the active-region-pillar comprising semiconductor material;
   a conductive structure adjacent a lower portion of the active-region-pillar;
   a first channel region comprising a first portion of the active-region-pillar between the digit-line-contact-region and the first storage-element-contact-region;
   a second channel region comprising a second portion of the active-region-pillar between the digit-line-contact-region and the second storage-element-contact-region;
   a first wordline over the conductive structure and adjacent the first portion of the active-region-pillar;
   a second wordline over the conductive structure and adjacent the second portion of the active-region-pillar;
   a digit-line coupled with the digit-line-contact-region;
   first and second storage-elements coupled with the first and second storage-element-contact-regions; and
   a voltage source coupled with the conductive structure; the conductive structure and voltage source being configured to provide a desired threshold voltage along the first and second channel regions.

12. The integrated assembly of claim 11 wherein the semiconductor material comprises silicon.

13. The integrated assembly of claim 12 comprising a boron concentration within the first and second channel regions of less than about $1 \times 10^{14}$ atoms/cm$^3$.

14. The integrated assembly of claim 12 comprising no detectable boron within the first and second channel regions.

15. The integrated assembly of claim 11 wherein:
   a first dielectric material is between the conductive structure and the lower portion of the active-region-pillar,
   a second dielectric material is between the first wordline and the first portion of the active-region-pillar, and
   the second dielectric material is between the second wordline and the second portion of the active-region-pillar.

16. The integrated assembly of claim 15 wherein the first and second dielectric materials are a same composition.

17. The integrated assembly of claim 15 wherein the first and second dielectric materials are different compositions.

18. An integrated assembly, comprising:
   active-region-pillars extending upwardly from a base; each of the active-region-pillars having contact regions associated therewith; the contact regions associated with each of the active-region-pillars including a pair of storage-element-contact-regions, and including a digit-line-contact-region between the storage-element-contact-regions of said pair; the active-region-pillars comprising silicon; the active-region-pillars being spaced from one another by intervening regions;
   a conductive structure over the base and within the intervening regions; the conductive structure extending around lower portions of the active-region-pillars;
   wordlines adjacent the active-region-pillars; regions of the active-region-pillars proximate the wordlines being channel regions;
   digit-lines coupled with the digit-line-contact-regions;
   storage-elements coupled with the storage-element-contact-regions; and
   a voltage source coupled with the conductive structure; the conductive structure and voltage source being configured to provide a desired threshold voltage along the channel regions.

19. The integrated assembly of claim 18 wherein the active-region-pillars are comprised by a memory array; wherein the memory array is within a tier; and wherein the tier is within a vertically-stacked arrangement of tiers.

20. The integrated assembly of claim 18 wherein the active-region-pillars are first active-region-pillars comprised by a first memory subarray, and further comprising a second memory subarray having second active-region-pillars substantially identical to the first active-region-pillars; the conductive structure being a first conductive structure; a second conductive structure extending around lower portions of the second active-region-pillars; and the voltage source being coupled with the second conductive structure.

21. The integrated assembly of claim 18 wherein the active-region-pillars are first active-region-pillars comprised by a first memory subarray, and further comprising a second memory subarray having second active-region-pillars substantially identical to the first active-region-pillars; the conductive structure being a first conductive structure; the channel regions being first channel regions; a second conductive structure extending around lower portions of the second active-region-pillars; the second active-region-pillars comprising second channel region; the voltage source being a first voltage source; and a second voltage source being coupled with the second conductive structure.

22. The integrated assembly of claim 21 wherein the first and second voltage sources are at different voltages relative to one another.

23. The integrated assembly of claim 21 wherein the first voltage source is at a different voltage during one operational mode of the first memory subarray than during another operational mode of the first memory subarray.

24. The integrated assembly of claim 21 wherein the first and second voltage sources are operated to maintain static threshold voltages within the first and second channel regions.

25. The integrated assembly of claim 21 wherein the first and second voltage sources are operated to provide dynamic threshold voltages within the first and second channel regions; the threshold voltage provided by the first voltage source being different when the first subarray is being actively addressed than when the first subarray is resting; and the threshold voltage provided by the second voltage source being different when the second subarray is being actively addressed than when the second subarray is resting.

* * * * *